United States Patent [19]
Narui et al.

[11] Patent Number: 5,475,237
[45] Date of Patent: Dec. 12, 1995

[54] LIGHT EMITTING DEVICE HAVING FIRST AND SECOND CLADDING LAYERS WITH AN ACTIVE LAYER AND CARRIER BLOCKING LAYER THEREBETWEEN

[75] Inventors: Fumiyo Narui; Masafumi Ozawa, both of Kanagawa, Japan

[73] Assignee: Sony Corporation, Tokyo, Japan

[21] Appl. No.: 395,976

[22] Filed: Feb. 28, 1995

Related U.S. Application Data

[63] Continuation of Ser. No. 224,574, Apr. 7, 1994, Pat. No. 5,420,446.

[30] Foreign Application Priority Data

Apr. 7, 1993 [JP] Japan .................... 5-105108

[51] Int. Cl.$^6$ .................... H01L 29/06; H01S 3/19
[52] U.S. Cl. .................... 257/22; 257/94; 257/103; 372/45
[58] Field of Search .................... 257/13, 22, 103, 257/94; 372/44, 45, 46

[56] References Cited

U.S. PATENT DOCUMENTS

| | | | |
|---|---|---|---|
| 5,260,958 | 11/1993 | Fitzpatrick | 372/45 |
| 5,268,918 | 12/1993 | Akimoto et al. | 372/45 |
| 5,291,507 | 3/1994 | Haase et al. | 372/44 |
| 5,319,219 | 6/1994 | Cheng et al. | 257/14 |
| 5,324,963 | 6/1994 | Kamata | 257/96 |
| 5,404,027 | 4/1995 | Haase et al. | 257/22 |

FOREIGN PATENT DOCUMENTS

| | | | |
|---|---|---|---|
| 0234955 | 9/1987 | European Pat. Off. | 372/45 |
| 63-038279 | 2/1988 | Japan | 257/94 |
| 3174504 | 7/1991 | Japan | 372/45 |
| 3257877 | 11/1991 | Japan | 372/45 |
| 4363086 | 12/1992 | Japan | 372/45 |
| 127832 | 2/1993 | Japan | 257/103 |
| 6-5920 | 6/1994 | Japan | 257/103 |

OTHER PUBLICATIONS

Electronics Letters, vol. 28, No. 19, 10 Sep. 1992, pp. 1798, 1799, Okuyama et al. "ZnSe/ZnMgSSe Blue Laser Diode".

Applied Physics Letters, "Distributed Feedback Operatio of Optically Pumped ZnSe Quantum–Well Lasers in the Blue–Green", vol. 60, No. 20, 18 May 1992, New York, pp. 2460–2462, Ishihara et al.

Hagerott et al., Applied Physics Letters, (60(23), 8 Jun. 1992, "Indium Tin Oxide as Transparent Electrode . . . quantum well light emitter".

Primary Examiner—Robert P. Limanek
Assistant Examiner—Minhloan Tran
Attorney, Agent, or Firm—Hill, Steadman & Simpson

[57] ABSTRACT

A light emitting device is formed of a substrate, a first cladding layer on the substrate, an active layer on the first cladding layer, and a second cladding layer on the active layer. A carrier blocking layer also serving as an etching stopping layer during formation of the second cladding layer is provided between the active layer and the second cladding layer. Both sides of the second cladding layer are filled by a semiconductor layer having a resistance substantially higher than the other layers which the filler layer is in contact with. The first and second cladding layers, active layer, carrier blocking layer, and semiconductor layer of higher resistance comprise a II–VI compound semiconductor.

5 Claims, 4 Drawing Sheets

LIGHT EMITTING DEVICE HAVING FIRST AND SECOND CLADDING LAYERS WITH AN ACTIVE LAYER AND CARRIER BLOCKING LAYER THEREBETWEEN

This is a continuation of application Ser. No. 08/224,574, filed Apr. 7, 1994, now U.S. Pat. No. 5,420,446.

BACKGROUND OF THE INVENTION

1. Field of the Invention

This invention relates to a selective etching method, an optoelectronic device and its fabricating method suitable for use in, for example, a semiconductor laser using a II-VI compound semiconductor.

2. Description of the Prior Art

In recent years, demand for semiconductor lasers capable of emitting light of short wavelengths has increased for improving the recording density of optical discs and resolution of laser printers, and vigorous studies have been done with the aim of realizing it.

The present Applicant, after earnest studies to meet such demand, already proposed a semiconductor laser using ZnMgSSe compound semiconductors as materials of cladding layers and other layers and capable of emitting blue to green light (for example, Japanese Patent Application No. Hei 4-229356).

The above-mentioned semiconductor laser using ZnMgSSe compound semiconductors, in general, additionally includes one or more materials such as ZnSe compound semiconductors other than ZnMgSSe compound semiconductors. When fabricating the semiconductor laser, selective etching may be needed to process the ZnSe compound semiconductor provided on a ZnMgSSe compound semiconductor layer into a mesa-type or other type pattern.

A method for etching the ZnSe compound semiconductor layer is a wet etching method using a $K_2Cr_2O_7$: $H_2SO_4$ etchant. In the wet etching method, however, the etching rate of the ZnMgSSe compound semiconductor layer is faster than the etching rate of the ZnSe compound semiconductor layer, which results in the underlying ZnMgSSe compound semiconductor layer being deeply etched during etching of the ZnSe compound semiconductor layer thereon.

Means heretofore available for preventing this problem is a method of estimating etching time required for etching the ZnSe compound semiconductor layer on the basis of the etching rate of the ZnSe compound semiconductor to control the etching depth in view of the estimated etching time. This method, however, involves a problem from the viewpoint of controllability and reproducibility.

OBJECTS AND SUMMARY OF THE INVENTION

It is therefore an object of the invention to provide a selective etching method excellent in controllability and reproducibility of selective etching of ZnSe, ZnTe, ZnSSe or $Zn_{1-a}Mg_aS_bSe_{1-b}$ compound semiconductor.

Another object of the invention is to provide an optoelectronic device fabricated by selective etching of znSe, ZnTe, ZnSSe or $Zn_{1-a}Mg_aS_bSe_{1-b}$ compound semiconductor with excellent controllability and reproducibility and hence improved in manufacturing yield.

Still another object of the invention is to provide a method for fabricating an optoelectronic device which can fabricate an optoelectronic device by selective etching of ZnSe, ZnTe, ZnSSe or $Zn_{1-a}Mg_aS_bSe_{1-b}$ compound semiconductor with excellent controllability and reproducibility and hence can be improved in manufacturing yield.

According to an aspect of the invention, there is provided a selective etching method comprising the steps of:

providing at least one layer to be etched made of a ZnSe, ZnTe, ZnSSe or $Zn_{1-a}Mg_aS_bSe_{1-b}$ ($0<a<1$, $0<b<1$) compound semiconductor on an etching stopping layer made of a $Zn_{1-x}Mg_xS_ySe_{1-y}$ ($0<x<1$, $0<y<1$, $a<x$) compound semiconductor; and selectively etching the at least one layer to be etched by a dry etching method.

For example, a reactive ion etching (RIE) method is used as the dry etching method.

According to another aspect of the invention, there is provided an optoelectronic device comprising:

a first layer made of a $Zn_{1-x}Mg_xS_ySe_{1-y}$ ($0<x<1$, $0<y<1$) compound semiconductor; and at least one second layer provided on the first layer and made of a ZnSe, ZnTe, ZnSSe or $Zn_{1-a}Mg_aS_bSe_{1-b}$ ($0<a<1$, $0<b<1$, $a<x$) compound semiconductor.

The optoelectronic device according to the invention may be any one of light emitting devices such as semiconductor lasers and light emitting diodes, electronic devices such as transistors, and composite devices of such light emitting devices and electronic devices.

An example of optoelectronic devices according to the invention is a semiconductor laser in which the first layer is a carrier blocking layer and the second layer is a cladding layer.

Another example of optoelectronic devices according to the invention is a distributed feedback semiconductor laser in which the first layer is an optical waveguide layer and the second layer is one which makes a diffraction grating.

According to still another aspect of the invention, there is provided a method for fabricating an optoelectronic device comprising the steps of:

providing at least one second layer made of a ZnSe, ZnTe, ZnSSe or $Zn_{1-a}Mg_aS_bSe_{1-b}$ ($0<a<1$, $0<b<1$) compound semiconductor on a first layer made of a $Zn_{1-x}Mg_xS_ySe_{1-y}$ ($0<x<1$, $0<y<1$, $a<x$) compound semiconductor; and selectively etching the at least one second layer by a dry etching method.

For example, a reactive ion etching (RIE) method is used as the dry etching method.

According to the selective etching method provided by the present invention, in case of etching the layer to be etched made of a ZnSe, ZnTe, ZnSSe or $Zn_{1-a}Mg_aS_bSe_{1-b}$ ($0<a<1$, $0<b<1$) compound semiconductor by dry etching methods such as the RIE method, since the etching selectivity of the layer to be etched can be made sufficiently large with respect to the underlying etching stopping layer made of the $Zn_{1-x}Mg_xS_ySe_{1-y}$ ($0<x<1$, $0<y<1$, $a<x$) compound semiconductor, the etching can automatically be stopped at a point of time when the etching has reached to expose the etching stopping layer. Therefore, selective etching of the ZnSe, Znte, ZnSSe or $Zn_{1-a}Mg_aS_bSe_{1-b}$ compound semiconductor can be performed with excellent controllability and reproducibility.

According to the optoelectronic device provided by the present invention, when the second layer made of a ZnSe, ZnTe, ZnSSe or $Zn_{1-a}Mg_aS_bSe_{1-b}$ ($0<a<1$, $0<b<1$) compound semiconductor on the first layer made of a $Zn_{1-x}Mg_xS_ySe_{1-y}$ ($0<x<1$, $0<y<1$, $a<x$) is etched by dry etching methods such as the RIE method, the underlying first layer behaves as an etching stopping layer to enable selective etching of the second layer with excellent controllability and reproducibility. As a result, an accurate thickness as designed for the first layer is realized, and the optoelectronic device is improved in manufacturing yield.

According to the method for fabricating an optoelectronic device provided by the present invention, when the second layer made of a ZnSe, ZnTe, ZnSSe or $Zn_{1-a}Mg_aS_bSe_{1-b}$ (0<a<1, 0<b<1) compound semiconductor on the first layer made of a $Zn_{1-x}Mg_xS_ySe_{1-y}$ (0<x<1, 0<y<1, a<x) is etched by dry etching metods such as the RIE method, the underlying first layer behaves as an etching stopping layer to enable selective etching of the second layer with excellent controllability and reproducibility. As a result, an accurate thickness as designed for the first layer is realized, and the optoelectronic device is improved in manufacturing yield.

In particular when the optoelectronic device is a semiconductor laser in which the first layer is a carrier blocking layer and the second layer is a cladding layer, an accurate thickness as designed for the carrier blocking layer is realized. Also when the optoelectronic device is a distributed feedback semiconductor laser in which the first layer is an optical waveguide layer and the second layer is one which forms a diffraction grating, an accurate thickness as designed for the optical waveguide layer is realized.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

The present inventors prepared samples by epitaxially growing on a GaAs substrate a ZnSe layer, a ZnTe layer, a ZnSSe layer (in lattice matching with the GaAs substrate) and a ZnMgSSe layer (with Mg composition ratio being 0.09 and in lattice matching with the GaAs substrate), respectively, and conducted an experiment of etching with the samples by using the reactive ion etching (RIE) method. In the RIE a mixed gas of $SiCl_4$ and He was used as an etching gas and the same etching conditions were used.

The experiment revealed the etching rate of the ZnMgSSe layer with the composition ratio of Mg being 0.09 to be about a half the etching rate of the ZnSe, ZnTe or ZnSSe layer.

Figure 7:
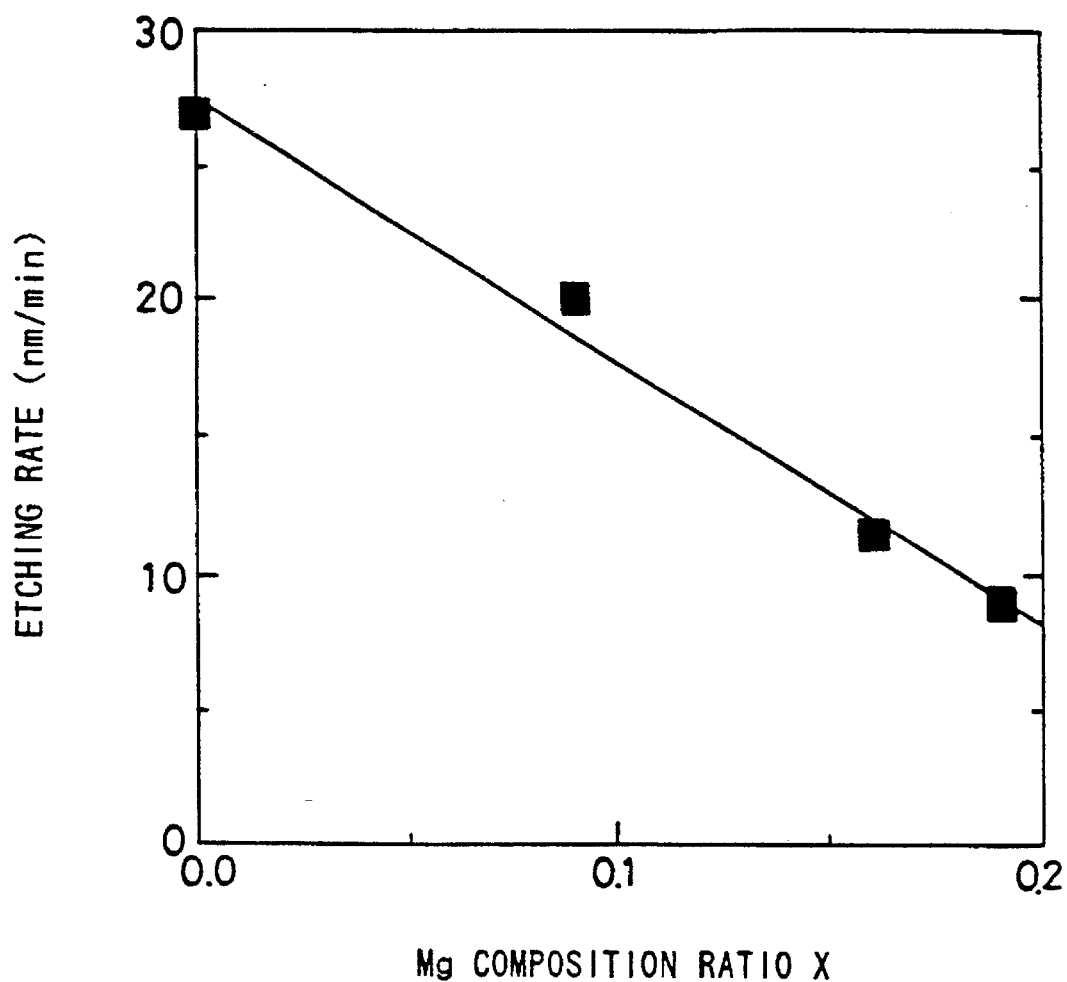
FIG. 7 is a graph showing a result of measurement of dependency of the etching rate on Mg composition ratio when etching a $Zn_{1-x}Mg_xS_ySe_{1-y}$ layer by the RIE method.

Apart from the foregoing experiment, the present inventors prepared samples by epitaxially growing on a GaAs substrate $Zn_{1-x}Mg_xS_ySe_{1-y}$ layers different in Mg composition ratio and conducted another experiment to know dependency of the etching rate of the $Zn_{1-x}Mg_xS_ySe_{1-y}$ layer upon Mg composition ratio, and resulted as shown in FIG. 7. In these samples, the $Zn_{1-x}Mg_xS_ySe_{1-y}$ layers were lattice-matched with the GaAs substrate. Etching in this experiment, like the former experiment, was performed by the RIE method using the mixed gas of $SiCl_4$ and He ($SiCl_4$:He= 10:8.6) as an etching gas. Power used was 100 W, and pressure was 3.3 Pa (25 mTorr). It is known from FIG. 7 that the etching rate the $Zn_{1-x}Mg_xS_ySe_{1-y}$ layer exhibits a substantially linear decrease as the Mg composition ratio x increases and that the etching rate decreases by 10 nm/min when the Mg composition ratio x increases by 0.1 (10%).

Results of the experiments reveal that, during etching of the ZnSe, ZnTe Or ZnSSe layer provided on the ZnMgSSe layer by the RIE method, the ZnMgSSe layer thereunder behaves as an etching stopping layer, and provides excellent controllability and reproducibility in selective etching of the ZnSe, ZnTe or ZnSSe layer to be etched. Also when another ZnMgSSe layer formed on the ZnMgSSe layer is etched by the RIE method, the underlying ZnMgSSe layer behaves as an etching stopping layer, provided the Mg composition ratio of the ZnMgSSe layer to be etched is sufficiently smaller than that of the underlying ZnMgSSe layer, and enables selective etching of the ZnMgSSe layer to be etched with excellent controllability and reproducibility.

The same applies not only when the RIE method is used but also when other dry etching methods are used.

Embodiments of the invention are now described below with reference to the drawings. In all the drawings illustrating the embodiments, common reference numerals are assigned to common or equivalent elements.

Figure 1:
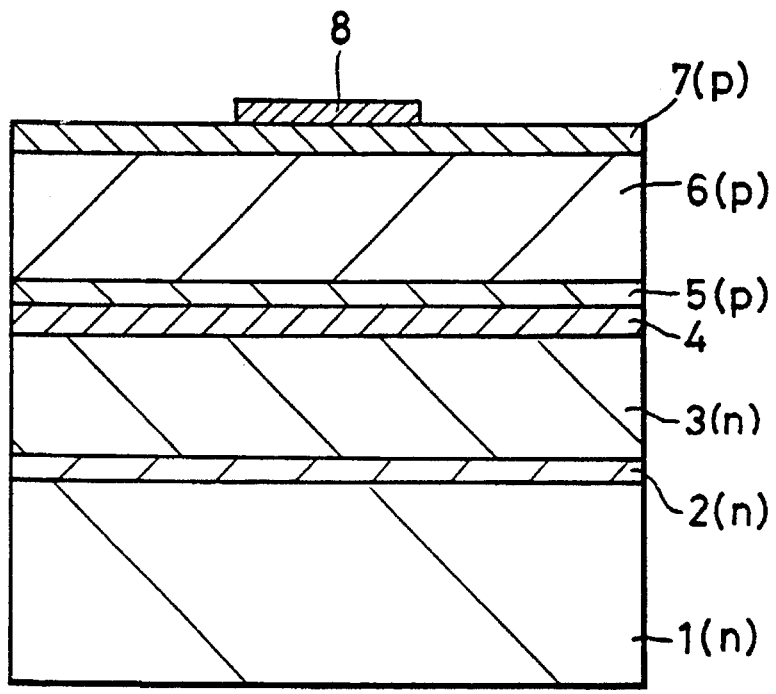
FIGS. 1 to 3 are cross-sectional views for explaining a method for fabricating a semiconductor laser according to a first embodiment of the invention.
Figure 2:
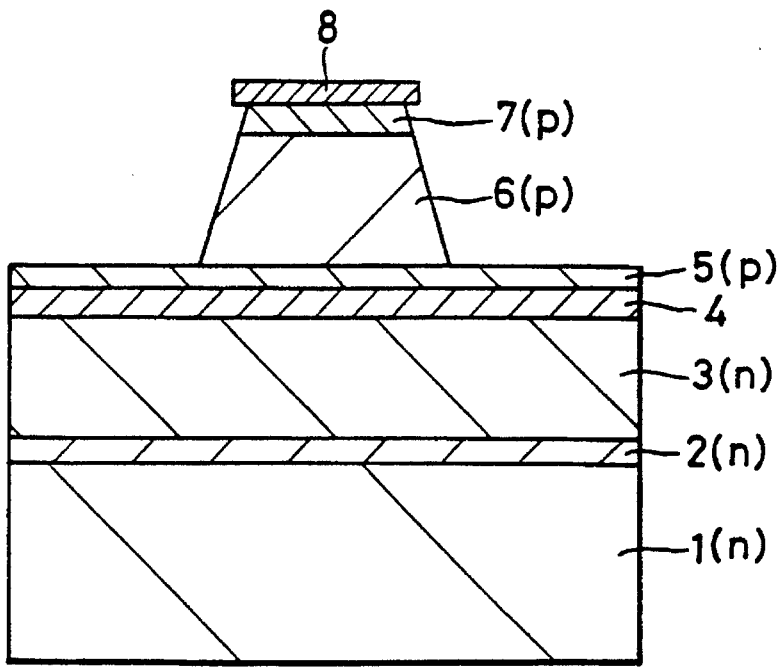
Figure 3:
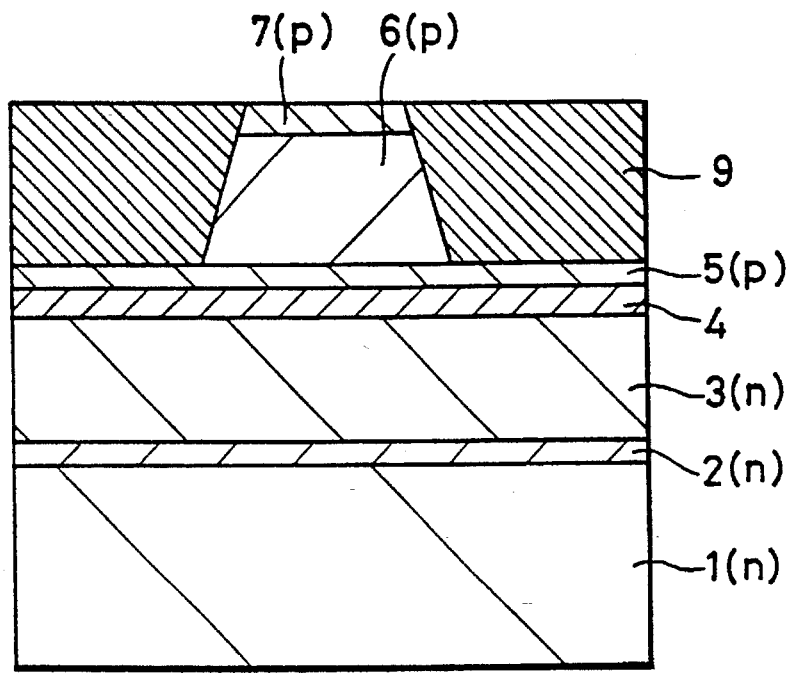

FIGS. 1 to 3 are cross-sectional views showing sequential steps of a method for fabricating a semiconductor laser according to a first embodiment of the invention.

First, as shown in FIG. 1, the first embodiment epitaxially grows, for example, on a (100)-oriented n-type GaAs substrate 1, an n-type ZnSe buffer layer 2, an n-type $Zn_{1-x1}Mg_{x1}S_{y1}Se_{1-y1}$ cladding layer 3, an active layer 4 made of, for example, ZnSe or ZnSSe layer, a p-type $Zn_{1-x2}Mg_{x2}S_{y2}Se_{1-y2}$ layer 5 which is used as an etching stopping layer upon etching by the RIE method referred to later and a carrier blocking layer for effectively accomplishing carrier confinement, a p-type $Zn_{1-x3}Mg_{x3}S_{y3}Se_{1-y3}$ cladding layer 6, and a p-type ZnSe cap layer 7 in sequence by, for example, the molecular beam epitaxy (MBE) method, and thereafter makes a stripe-shaped mask 8 on the p-type ZnSe cap layer 7. The mask 8 is made of a material resistant to etching by the RIE method referred to later. In this case, the Mg composition ratio x1 of the n-type $Zn_{1-x1}Mg_{x1}S_{y1}Se_{1-y1}$ cladding layer 3 and the Mg composition ratio x3 of the p-type $Zn_{1-x3}Mg_{x3}S_{y3}Se_{1-y3}$ cladding layer 6 may be, for example, 0.1 (10%), and the Mg composition ratio x2 of the p-type $Zn_{1-x2}Mg_{x2}S_{y2}Se_{1-y2}$ layer 5 may be, for example, 0.25 (25%).

Next, by using the mask 8 and the RIE method using as an etching gas a mixed gas of, for example, $SiCl_4$ and He, the method sequentially etches the p-type ZnSe cap layer 7 and the p-type $Zn_{1-x3}Mg_{x3}S_{y3}Se_{1-y3}$ cladding layer 6 in the vertical direction of the substrate surface. As a result, as shown in FIG. 2, the p-type ZnSe cap layer 7 and the p-type $Zn_{1-x3}Mg_{x3}S_{y3}Se_{1-y3}$ cladding layer 6 are etched into a mesa-type pattern. Since the etching rate of the underlying p-type $Zn_{1-x2}Mg_{x2}S_{y2}Se_{1-y2}$ layer 5 having the Mg composition ratio x2=0.25 is sufficiently smaller than the etching rates of the p-type ZnSe cap layer 7 and the p-type $Zn_{1-x3}Mg_{x3}S_{y3}Se_{1-y3}$ cladding layer 6 having the Mg composition ratio x3=0.1 which are to be etched, the p-type $Zn_{1-x2}Mg_{x2}S_{y2}Se_{1-y2}$ layer 5 behaves as an etching stopping layer during the etching process. Therefore, when the etching has reached to expose the p-type $Zn_{1-x2}Mg_{x2}S_{y2}Se_{1-y2}$ layer 5, it is automatically stopped.

Next, after the mask 8 is removed, as shown in FIG. 3, a ZnSe filler layer 9 of resistance substantially higher than the other layers which the filler layer 9 is in contact with, for example, is epitaxially grown to fill opposite sides of the p-type $Zn_{1-x3}Mg_{x3}S_{y3}Se_{1-y3}$ cladding layer 6 and the p-type ZnSe cap layer 7 made into the mesa-type pattern.

Next, although not shown, a p-side electrode such as, for example, Au electrode, in ohmic contact with the p-type ZnSe cap layer 7 is formed, and an n-side electrode such as, for example, In electrode, in ohmic contact with the n-type GaAs substrate 1 is formed on the back surface of the n-type GaAs substrate 1.

After that, the n-type GaAs substrate 1 having the laser structure made thereon as explained above is cleaved into bars to form reflective end surfaces, and the bars are processed into chips. Then by packaging the chips, the target semiconductor lasers are finished.

As explained above, according to the first embodiment, since the underlying p-type $Zn_{1-x2}Mg_{x2}S_{y2}Se_{1-y2}$ layer 5 behaves as an etching stopping layer when the p-type ZnSe cap layer 7 and the p-type $Zn_{1-x3}Mg_{x3}S_{y3}Se_{1-y3}$ cladding layer 6 are etched by the RIE method, the p-type $Zn_{1-x2}Mg_{x2}S_{y2}Se_{1-y2}$ layer 5 is effectively prevented from being etched. As a result, as compared with the existing method using a wet etching method and involving a difficulty in obtaining an accurate thickness as designed for the p-type $Zn_{1-x2}Mg_{x2}S_{y2}Se_{1-y2}$ layer 5 because it controlled the etching depth on the basis of the etching time, the invention can make an accurate thickness as designed for the p-type $Zn_{1-x2}Mg_{x2}S_{y2}Se_{1-y2}$ layer 5 which is used as a carrier blocking layer in the final structure. Thus the semiconductor laser can be improved in manufacturing yield.

Figure 4:
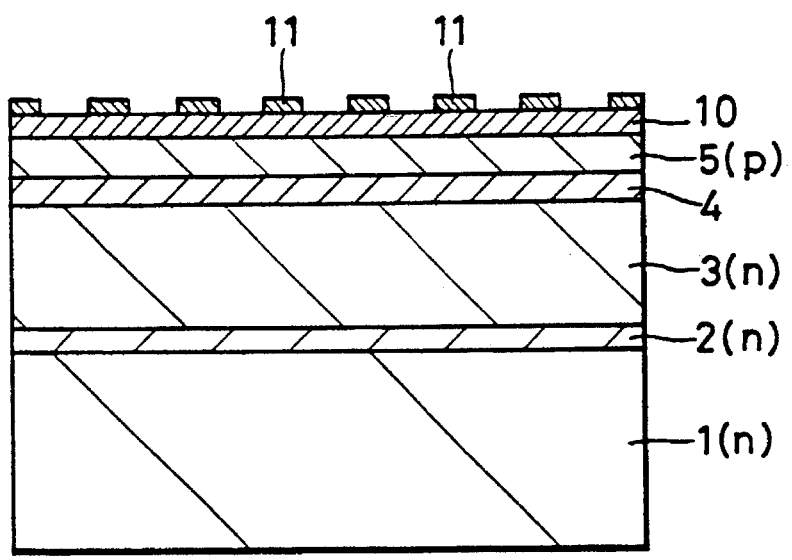
FIGS. 4 to 6 are cross-sectional views for explaining a method for fabricating a semiconductor laser according to a second embodiment of the invention.
Figure 5:
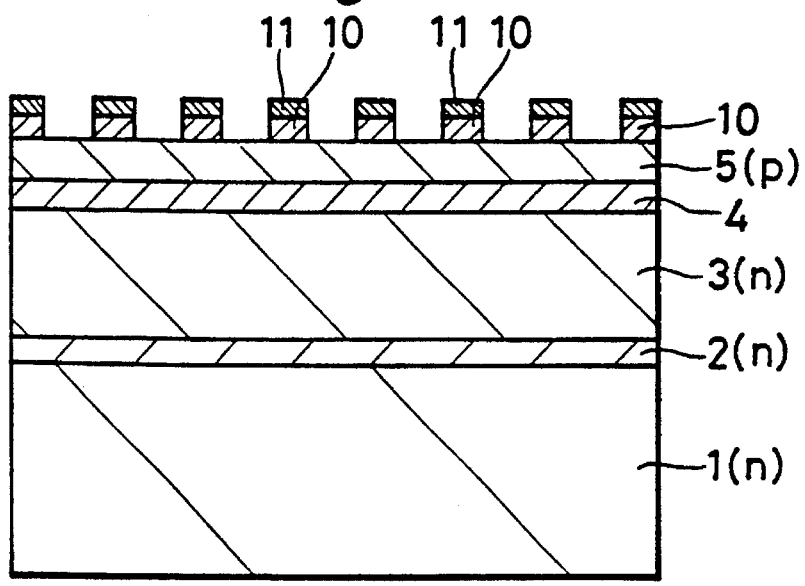
Figure 6:
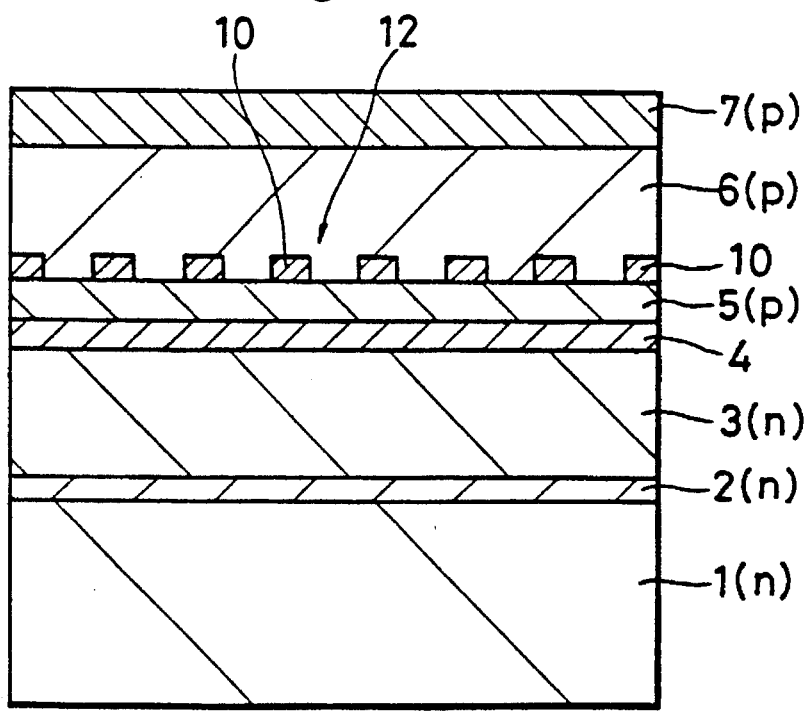

FIGS. 4 to 6 are cross-sectional views showing sequential steps of a method for fabricating a semiconductor laser according to a second embodiment of the invention. The semiconductor laser according to the second embodiment is a distributed feedback semiconductor laser.

First, as shown in FIG. 4, by using, for example, the MBE method, the second embodiment epitaxially grows on, for example, a (100)-oriented n-type GaAs substrate 1, an n-type ZnSe buffer layer 2, an n-type $Zn_{1-x1}Mg_{x1}S_{y1}Se_{1-y1}$ cladding layer 3, an active layer 4 made of, for example, ZnSe or ZnSSe layer, a p-type $Zn_{1-x2}Mg_{x2}S_{y2}Se_{1-y2}$ layer 5 which is used as an etching stopping layer upon etching by the RIE method referred to later and an optical waveguide layer, and a ZnSe layer 10 for forming a diffraction grating in sequence, and thereafter makes on the p-type ZnSe layer 10 a mask 11 having a pattern corresponding to the diffraction grating to be formed. The mask 11 is made of a material resistant to etching by the RIE method referred to later. The Mg composition ratio x2 of the p-type $Zn_{1-x2}Mg_{x2}S_{y2}Se_{1-y2}$ layer 5 may be, for example, 0.10 (10%).

Next, by using the mask 11 and the RIE method using as an etching gas a mixed gas of, for example, $SiCl_4$ and He, the method etches the ZnSe layer 10 in the vertical direction of the substrate surface. As a result, as shown in FIG. 5, the ZnSe layer 10 is etched in a pattern of the diffraction grating desired. Since the etching rate of the underlying p-type $Zn_{1-x2}Mg_{x2}S_{y2}Se_{1-y2}$ layer 5 is sufficiently smaller than the etching rate of the ZnSe layer 10 to be etched, the p-type $Zn_{1-x2}Mg_{x2}S_{y2}Se_{1-y2}$ layer 5 behaves as an etching stopping layer during the etching process. Therefore, when the etching has reached to expose the p-type $Zn_{1-x2}Mg_{x2}S_{y2}Se_{1-y2}$ layer 5, it is automatically stopped.

Next, as shown in FIG. 6, the mask 11 is removed, and after a p-type $Zn_{1-x3}Mg_{x3}S_{y3}Se_{1-y3}$ cladding layer 6 is epitaxially grown to cover the diffraction grating 12 thus made, a p-type ZnSe cap layer 7 is epitaxially grown thereon.

After that, in the same manner as the first embodiment, through provision of a p-side electrode and an n-side electrode, cleavage, and other steps, the target distributed feedback semiconductor lasers are finished.

According to the second embodiment, since the underlying p-type $Zn_{1-x2}Mg_{x2}S_{y2}Se_{1-y2}$ layer 5 behaves as an etching stopping layer when the ZnSe layer 10 for making a diffraction grating thereon is etched by the RIE method, the p-type $Zn_{1-x2}Mg_{x2}S_{y2}Se_{1-y2}$ layer 5 is effectively prevented from being etched. As a result, while making an accurate thickness as designed for the p-type $Zn_{1-x2}Mg_{x2}S_{y2}Se_{1-y2}$ layer 5 which is used as an optical waveguide layer in the final structure, the diffraction grating 12 can be made. Thus the distributed feedback semiconductor laser can be improved in manufacturing yield.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first and second embodiments have been described as using a mixed gas of $SiCl_4$ and He as the RIE etching gas, a different mixed gas of, for example, $BCl_3$ and He may be used as the etching gas.

The ZnSe layer 9 used as a filler layer in the first embodiment may also be replaced by, for example, a ZnSSe layer, a ZnMgSSe layer or other insulating materials such as polyimide, $Al_2O_3$, etc.

The ZnSe layer 10 used for making the diffraction grating in the second embodiment may also be replaced by a ZnSSe layer.

Further, the p-type ZnSe cap layer 7 used in the first and second embodiments may be replaced by a p-type ZnTe cap layer, and a p-type ZnTe cap layer may be further provided on the p-type ZnSe cap layer 7.

Moreover, the particular values shown for the Mg composition ratios x1, x2 and x3 of the n-type $Zn_{1-x1}Mg_{x1}S_{y1}Se_{1-y1}$ cladding layer 3, the p-type $Zn_{1-x2}Mg_{x2}S_{y2}Se_{1-y2}$ optical waveguide layer 5 and the p-type $Zn_{1-x3}Mg_{x3}S_{y3}Se_{1-y3}$ cladding layer 6 are merely examples, and desired values may be chosen for these composition ratios x1, x2 and x3.

As described above, according to the selective etching method provided by the invention, selective etching of ZnSe, ZnTe, ZnSSe or $Zn_{1-a}Mg_aS_bSe_{1-b}$ compound semiconductor can be conducted with excellent controllability and reproducibility.

According to the optoelectronic device and its fabricating method provided by the invention, because of its znSe, ZnTe, ZnSSe or $Zn_{1-a}Mg_aS_bSe_{1-b}$ compound semiconductor being selective etched with excellent controllability and reproducibility, the manufacturing yield of the optoelectronic device can be improved.

What is claimed is:

1. A light emitting device, comprising:

a substrate;

a first cladding layer on said substrate;

an active layer on said first cladding layer;

a second cladding layer on said active layer;

a carrier blocking layer for carrier confinement and also serving as an etching stopping layer during formation of said second cladding layer between said active layer and said second cladding layer;

both sides of said second cladding layer being filled by a semiconductor filler layer having a resistance substantially higher than other layers which the filler layer is in contact with; and said first and second cladding layers, active layer, carrier blocking layer, and semiconductor filler layer comprising a II-VI compound semiconductor.

2. A light emitting device according to claim 1 wherein said first and second cladding layers comprise ZnMgSSe.

3. A light emitting device according to claim 1 wherein said carrier blocking layer comprises ZnMgSSe.

4. A light emitting device according to claim 1 wherein said filler layer comprises ZnSe.

5. A light emitting device, comprising:

a substrate;

a n-ZnMgSSe cladding layer on said substrate;

an active layer comprising a compound selected from the group consisting of ZnSe and ZnSSe on said n-ZnMgSSe cladding layer;

a p-ZnMgSSe cladding layer on said active layer;

a p-ZnMgSSe carrier blocking layer for carrier confinement and also serving as an etching stopping layer during formation of said second cladding layer between said active layer and said second cladding layer; and both sides of said p-ZnMgSSe cladding layer being filled by a ZnSe filler layer having a resistance substantially higher than the other layers which the filler layer is in contact with.

* * * * *